United States Patent [19]

Borchert et al.

[11] Patent Number: 4,775,883
[45] Date of Patent: Oct. 4, 1988

[54] ASYMMETRICAL THYRISTOR AND METHOD FOR PRODUCING SAME

[75] Inventors: Edgar Borchert, Warstein; Holger Schoof, Rüthen; Karl H. Sommer; Alois Sonntag, both of Warstein, all of Fed. Rep. of Germany

[73] Assignee: Licentia Patent-Verwaltungs- GmbH, Frankfurt, Fed. Rep. of Germany

[21] Appl. No.: 903,632

[22] Filed: Sep. 4, 1986

[30] Foreign Application Priority Data

Sep. 5, 1985 [DE] Fed. Rep. of Germany ....... 3531631

[51] Int. Cl.$^4$ ............................................. H01L 29/74
[52] U.S. Cl. ........................................ 357/38; 357/20; 357/89; 357/90; 357/55
[58] Field of Search ....................... 357/20, 38, 55, 89, 357/90

[56] References Cited

U.S. PATENT DOCUMENTS

| | | | |
|---|---|---|---|
| 4,223,328 | 9/1980 | Terasawa et al. | 357/90 |
| 4,243,999 | 1/1981 | Azuma et al. | 357/38 |
| 4,517,582 | 5/1985 | Sittig | 357/90 |

FOREIGN PATENT DOCUMENTS 0109331  5/1984  European Pat. Off. .
2923693  1/1980  Fed. Rep. of Germany .

OTHER PUBLICATIONS

P. Iseghem, "P-I-N Epitaxial Str. for High Power Devices," IEEE Transactions on Electron Devices, vol. ED-23, No. 8, Aug. 1976, pp. 823-825.
GEC Journal of Science & Technology, vol. 46, No. 2, 1980, article by B. V. Cordingley et al.
Cordingley and Chamund, "Design and Performance of a Medium-Power Asymmetrical Thyristor", 1980, pp. 67-71, GEC Journal of Sci & Tech, vol. 46, N. 2.

*Primary Examiner*—Joseph E. Clawson, Jr.
*Attorney, Agent, or Firm*—Spencer & Frank

[57] ABSTRACT

An asymmetrical thyristor having an $n^+pn^-np^-$ zone sequence whose functionability is not impaired and, in particular, whose reverse blocking characteristic is not degraded, if it fires after a forward current load and subsequent commutation before its turn-off time has expired due to the positive voltage increasing again. This insensitivity to refiring after commutation when falling below the turn-off time is realized by a flat rise of the doping concentration from the $n^-$-type zone to the n-type zone, with the doping concentration in the n-type layer increasing approximately exponentially over a path of at least $50\mu$. In order to keep the forward off-state current low with a flat $nn^-$ junction, the thickness and doping of the $n^-$-type layer are dimensioned such that at the highest intended forward off-state voltage the electric field intensity at the $pn^-$ junction is about $1.5 \cdot 10^5$ V/cm, drops approximately linearly in the $n^-$-type layer and, at the $nn^-$ junction, has approximately $\frac{1}{4}$ of the value it has at the $pn^-$ junction. Methods for producing such a thyristor are also disclosed.

3 Claims, 8 Drawing Sheets

ASYMMETRICAL THYRISTOR AND METHOD FOR PRODUCING SAME

BACKGROUND OF THE INVENTION

The present invention relates to an asymmetrical thyristor (ASCR) and to a method for producing such a thyristor. More particularly, the present invention relates to an asymmetrical thyristor composed of a wafer-shaped semiconductor body having at least four zones of alternatingly opposite conductivity types in which the two outer zones are respectively of highly doped n and highly doped p, conductivity types, and the n-conductive base zone is composed of a weakly doped n-conductive layer which is adjacent the inner p-conductive base zone and a higher doped n-conductive layer which is adjacent the outer p+ conductivity-type layer.

Asymmetrical thyristors whose blocking capability in the reverse direction is relatively small compared to their blocking capability in the forward direction are disclosed in an article by J. T. Fichet et al, "High Current High Voltage Asymmetrical SCRs", *PROCEEDINGS OF 29th IEEE ELECTRONIC COMPONENTS CONF.*, N. Y. 1979, pages 75–79. The principle of such a prior art asymmetrical thyristor is shown in FIG. 1 which is a schematic illustration of an asymmetrical thyristor.

The asymmetrical thyristor (ASCR) of FIG. 1, like a normal thyristor (SCR), is composed of four successive zones of alternatingly opposite conductivity types to provide a pnpn structure, with the two outer zones 1 and 4 being called the emitter zones and the two inner zones 2 and 3 being called the base zones. In a conventional manner, the p+-type emitter zone 1 is followed, toward the interior, by the n-type base zone 2 which is followed by the p-conductive control base zone 3 which is adjacent, toward the exterior, to the n+-type emitter zone 4 and which conventionally has portions which extend to the outer surface plane of the n+-type emitter zone 4, (not shown in FIG. 1).

Between the p+-type emitter zone 1 and the n-type base zone 2 there is a pn-junction $J_1$, between the n-type base zone 2 and the p-type control base zone 3 there is a pn-junction $J_2$ and between the p-type control base zone 3 and the n+-type emitter zone 4 there is a pn-junction $J_3$. The outer surface of the p+-type emitter zone 1 is alloyed or soldered onto a substrate disk 5 which is provided with a terminal 6 to supply current. The outer surface of the n+-type emitter zone 4 is provided with a metal contacting layer 7 and a terminal 8 to supply current. In a conventional manner, the exposed surface of the p-type control base zone 3 is provided with a contacting layer (not shown in FIG. 1) and a control terminal. The n-type base zone 2 is at floating potential.

In contrast to a normal thyristor, the n-type base zone 2 of an asymmetrical thyristor is composed of two layers, namely a weakly n-doped or n−-type layer 2a adjacent the control base zone 3 and a higher n-doped or n-type layer 2b adjacent the p+-type emitter zone 1. Due to the relatively high doping concentration of the n-type base layer 2b, the reverse blocking capability produced by pn-junction $J_1$ is relatively small, for example, about 100V. However, the forward blocking capability produced by pn−-junction $J_2$ is high, for example, about 1,300V, because of the low doping and the relatively great thickness or width of the n−-type base layer 2a.

In such a thyristor, it is desirable to realize the greatest possible and permissible forward off-state voltage $V_{DRM}$. That means that the area below the field intensity profile E(x) must be made as large as possible, with the maximum field intensity being less than the critical field intensity Ecrit at which avalanche breakdown occurs. For this reason, prior art devices, as disclosed, for example, in an article by P. Van Iseghem, "p-i-n Epitaxial Structures for High Power Devices", *IEEE TRANSACTIONS ON ELECTRON DEVICES*, Vol. Ed. 23, No. 8, August 1976, pages 823–825, and in FIG. 1 and in FIG. 2 of an article by B. V. Cordingly et al entitled "Design and Performance of an Asymmetrical Thyristor", *GEC JOURNAL OF SCIENCE & TECHNOLOGY*, Vol. 46, No. 2, 1980, exhibit a "box shaped" field intensity profile or curve in the base zone 2.

According to these prior art devices the field intensity E(x) extends approximately horizontally to or with a very slight slope with respect to the n−-type layer 2a. In the n-type layer 2b, however, the field intensity E(x) drops relatively steeply to almost zero at the nn− junction $J_{hl}$, so that the space charge zone penetrates only slightly into the n-type layer 2b, which has an advantageous effect on the forward blocking capability. The described field curves are realized by a low doping concentration in the n−-type layer 2a and a relatively steep rise of the doping concentration from the n−-type layer 2a to the n-type layer 2b.

In such known asymmetrical thyristors there now occurs the problem that, during commutation from the on-state to the off-state and subsequent reapplication of the positive voltage before the end of the turn-off time, the function of the devices is adversely affected by the inevitable refiring, especially at higher rates of rise of the forward off-state voltage. The adverse effect is that after every commutation, the reverse voltage $V_{RRM}$ of the thyristors continues to decrease, and finally the thyristors may be destroyed completely which is a severe drawback for the practical use of such thyristors.

SUMMARY OF THE INVENTION

It is an object of the present invention to provide an asymmetrical thyristor, and a method for producing same, which endures, after commutation, refiring before the turn-off time has elapsed, without being adversely influenced in its operation or even destroyed, and which therefore does not exhibit the above-mentioned drawbacks of decreasing reverse voltage when refired by a positive voltage after a commutation.

The above object is with regard to the thyristor achieved according to the present invention, by an asymmetrical thyristor made of a disk-shaped semiconductor body having at least four successive zones of alternatingly opposite conductivity types in which the two outer zones are highly n doped and highly p doped, respectively, and in which the n-conductive inner base zone is composed of a weakly doped n−-type layer adjacent the inner p-type control base zone and a higher doped n-type layer adjacent the outer p+-type zone, and wherein the doping curve at the nn− junction is so flat and the field intensity at the nn− junction in the stationary off-state is so low in the forward direction that, in the dynamic case during commutation and returning off-state voltage, the field intensity at this nn−junction is less than the critical field intensity which would lead to functional impairment of the thyristor.

More specifically, in the thyristor according to the invention, the thickness and doping concentration of the n$^-$-type layer are dimensioned in such a manner that the electric field intensity E(x) in this layer, if a forward off-state voltage i.e., a blocking voltage in the forward direction, is applied, has a finite average divergence (dE/dx) with an approximately linear curve and a maximum value E$_2$ at the pn$^-$ junction as well as a minimum value E$_{hl}$ at the nn$^-$ junction, and so that at the highest forward off-state voltage intended for the component, the maximum field intensity value E$_2$ is about 1.5 times 10$^5$V/cm and the minimum value E$_{hl}$ lies in a range from 0.1 E$_2$ to 0.4 E$_2$ and preferably from 0.2 E$_2$ to 0.3 E$_2$.

In this connection, it is of advantage for the doping concentration in the n-type base layer 2b to rise exponentially to its maximum value from the nn$^-$ junction J$_{hl}$ in the direction toward the pn junction J$_1$ on the anode side along a thickness path of at least 50µ.

Preferably, the p$^+$n junction, i.e., the pn junction on the anode side of the device between the outer p$^+$ region and the n-type layer of the n-conductive base zone, is at least 25µ from the anode outer surface of the semiconductor body.

The invention is based on the surprising realization that the adverse effect and possible destruction of the thyristor during refiring after commutation as a result of excessive local field intensity is initiated at the nn$^-$ junction J$_{hl}$ disposed between the n-type layer 2b and the n$^-$-type layer 2a, as will be explained in greater detail below.

Let it be assumed here that the local field intensity maxima occurring at the nn$^-$ junction J$_{hl}$ are the cause of the degradation and destruction occurring after firing upon the application of a forward voltage before the end of the turn-off time. In firing channel Z (see FIG. 1) created by local on-state polarization of pn junction J$_3$, the concentration of the electrons injected through this pn junction J$_3$ may become so high that the donor concentration in the n$^-$-type layer 2a is overcompensated, and thus the resulting space charge becomes negative. Then the electric field intensity curve in firing channel Z rises from the pn$^-$ junction J$_2$ to the nn$^-$ junction J$_{hl}$ and there reaches its maximum, as shown by curve 11 in FIG. 2.

The concentration of the current lines in firing channel Z and the high electric field intensity at the nn$^-$ junction J$_{hl}$ lead to a concentration of electrical power losses and thermal overloads in a spatially narrowly defined area. At a sufficiently high temperature, the resulting thermal generation of charge carrier pairs produces a thermal runaway which leads to the development of local melting or even melted channels, thereby totally damaging the component and interfering with its function or destroying it. If the field intensity maximum in firing channel Z lies above 1.5·10$^5$V/cm, impact ionization may generate so many charge carrier pairs that the thus increased current density initiates the thermal runaway.

In asymmetrical thyristors having a relatively steep nn$^-$ junction J$_{hl}$, it was found that the destruction preferably begins in the area between the nn$^-$ junction J$_{hl}$ and the pn junction J$_1$. To explain this, it is assumed that the maximum of the electric field intensity in the firing channel shifts from the nn$^-$ junction J$_{hl}$ to the n-type layer 2b as soon as intensive charge carrier generation begins. The reason for this is considered to be the fact that the holes generated at the nn$^-$ junction J$_{hl}$ and flowing toward the p-type control base zone 3 reduce the negative space charge, while the electrons generated at the nn$^-$ junction J$_{hl}$ and flowing into the n-type layer 2b increase the negative space charge. Therefore, the intersection between the donor profile rising toward the pn junction J$_1$ and the electron concentration is shifted into the n-type layer 2b. However, this intersection indicates the position of the field intensity maximum.

The above object is further partially achieved by various methods or processes for forming the asymmetrical thyristor according to the invention using epitaxy, ion implantation and phosphorus deposition from planar solid-state sources to form the n-type layer of the n-conductive base zone.

DETAILED DESCRIPTION OF THE PREFERRED EMBODIMENTS

As explained above, a critical phase in the operation of an asymmetrical thyristor begins when, after a forward load and subsequent commutation, the forward voltage across the component increases rapidly before its turn-off time has expired. The asymmetrical thyristor is then fired because the p-type control base zone 3 still contains stored charge carriers from the preceding forward load. The holes which, during the rise in voltage, flow from the p-type control base zone 3 below n-type emitter zone 4 parallel to pn junction $J_3$ to the emitter base shorts of a conventionally constructed asymmetric thyristor then act as a control current. This control current is higher, the greater the still stored quantity of charge carriers.

Figure 1:
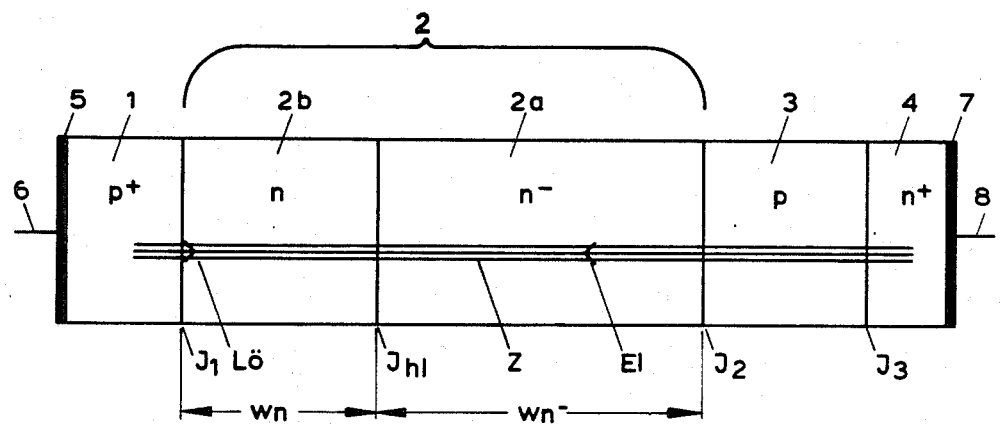
FIG. 1 schematically depicts the zone sequence of a typical asymmetrical thyristor.

Firing usually occurs locally at weak points, for example in regions where there are no emitter-base shorts or which are faulty due to technological errors. At such a weak point, pn junction $J_3$ is biased locally into the on state so that it injects electrons into the p-type control base zone 3 (see FIG. 1). The injected electrons flow through p-type control base zone 3 and through $n^-$-type layer 2a in the direction toward the $p^+$-type emitter zone 1, passing through the space charge zone of pn junction $J_2$. Due to the local injection, the electrons E1 flow in a narrow firing channel Z, for example, 100μ in diameter, and, for a period in the order of magnitude of microseconds, the current in firing channel Z is guided essentially by electrons while the holes Lo injected through pn junction $J_1$ contribute practically nothing to the current at this time. During this time period of primarily electron flow, the current flowing through the component is still relatively low, namely in an order of magnitude of 1A, while the current density in firing channel Z may take on high values in the order of magnitude of 100A/cm$^2$. The voltage across the component during the time period in question may lie near the maximum off-state voltage value given by the circuit if the off-state voltage rise rate has the customary high value for the particular application in the order of magnitude of 1000V/μs.

In firing channel Z, the electrons reach their limit speed of $v_1 \sim 10^7$ cm/s. Therefore, the electron current density $j_n$ of the electron concentration becomes proportional to n. With a sufficiently high electron current density $j_n$, i.e., with a sufficiently strong local on-state polarization of the pn junction $J_3$, the electron concentration n becomes greater than the doping $N_{DG}$ of the $n^-$-type layer 2a. Therefore, the space charge of the $n^-$-type layer 2a in firing channel Z changes its sign and thus the divergence of the electric field also changes its sign. That means that the maximum of the electric field has shifted from the $pn^-$ junction $J_2$ to the $nn^-$ junction $J_{hl}$, as shown in FIG. 2 by curves 10 and 11.

Figure 2:
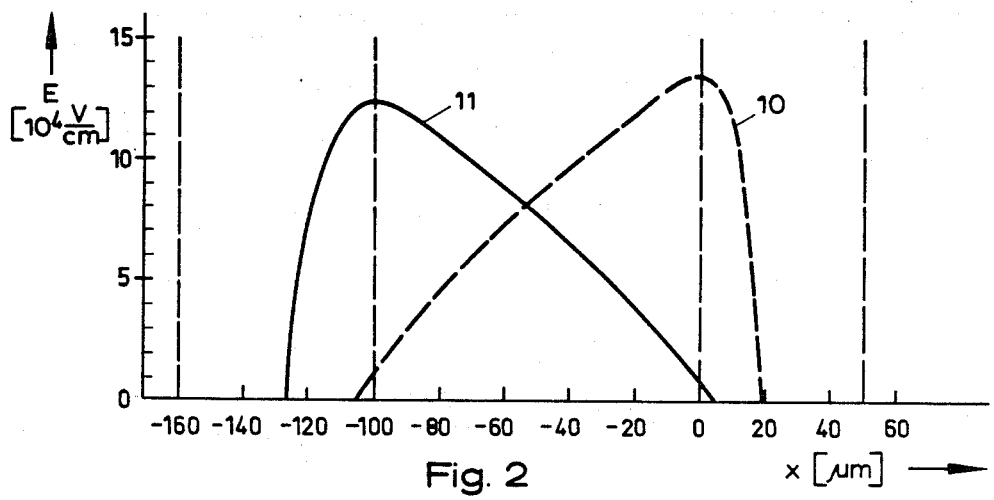
FIG. 2 shows the electric field intensity curve in the n-type layer of an asymmetrical thyristor according to the invention operating with a forward off-state voltage of 1000V.
Figure 5:
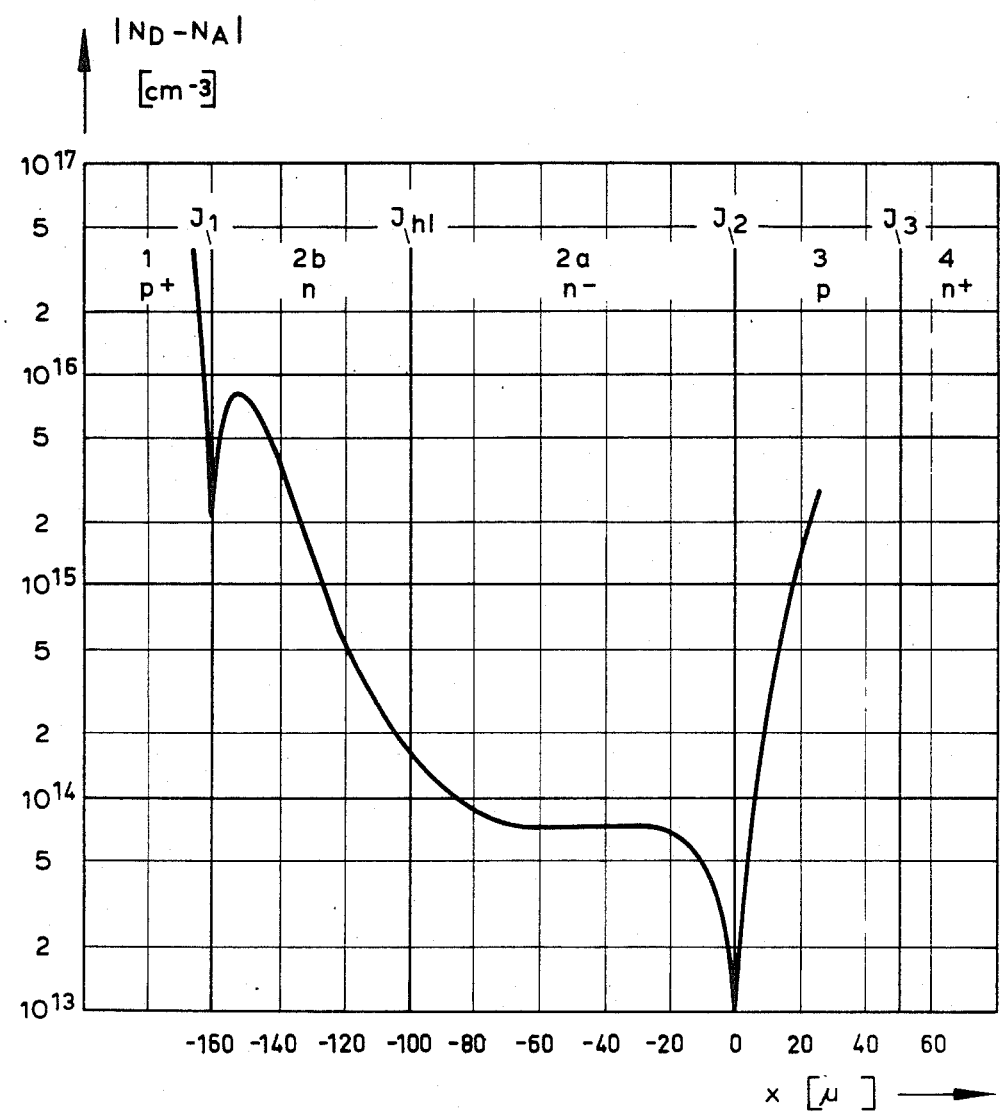
FIG. 5 shows the resulting doping curve for an asymmetrical thyristor according to the invention having a field intensity curve according to FIG. 3 and a doping profile according to FIG. 4.

Curve 10 of FIG. 2 represents the electric field intensity $E(x)$ outside the firing channel for the off-stage voltage $v_D$ existing at the respective point in time. Curve 10 practically coincides with the stationary curve of the electric field intensity $E(x)$ for the same $v_D$. The doping curve of an asymmetrical thyristor as shown in FIG. 5 is assumed to apply.

Curve 11 of FIG. 2 represents the electric field intensity $E(x)$ along the firing channel for the some momentary value of $v_D$ as curve 10. The part of the $n^-$-type layer 2a penetrated by the firing channel has become redoped, so to speak, by the relatively high electron concentration. It is assumed that the field divergence as a result of this redoping goes so far into the negative that the electric field intensity at pn junction $J_2$ is now only about $10^4$V/cm. Such a field intensity is sufficient to cause the electrons to flow at their limit speed $v_1$. The rise of curve 11 toward the left ends at the $nn^-$ junction $J_{hl}$ since the donor concentration rising toward the left in the n-type layer 2b soon exceeds the electron concentration in the firing channel. Therefore, a positive space charge exists in the firing channel in the n-type layer 2b, essentially determined by the donor concentration. Thus, the electric field intensity $E(x)$ drops on the left of the $nn^-$ junction $J_{hl}$ as can be seen in curve 11 of FIG. 2.

Due to the flat or gradual doping gradient in the n-type layer 2b, the left base point of the field intensity curve 11 is displaced from the $nn^-$ junction $J_{hl}$ into the n-type layer 2b. The field intensity curve $E(x)$ shown as curve 11 is similar to a flat $np^-$ junction. The area below curve 11, similarly to the area below curve 10, is here equal to the off-state voltage $v_D = 1000$V which is assumed to exist here. According to curve 11 of FIG. 2, the flat $nn^-$ junction $J_{hl}$ produces a broad but relatively low maximum for the electric field intensity $E(x)$ in the firing channel Z. Thus thermal overloads and impact ionizations are prevented in the firing channel Z.

Figure 3:
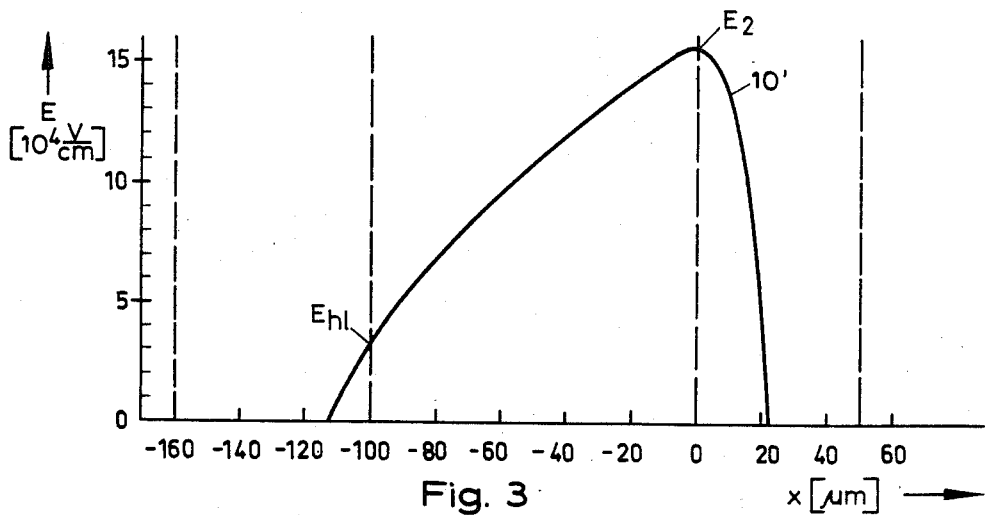
FIG. 3 shows the electric field intensity curve in the n-type layer of an asymmetrical thyristor according to the invention operating with a forward off-state voltage of 1300V.

In FIG. 3, curve 10' depicts the electric field intensity $E(x)$ in the $n^-$-type layer 2a of an asymmetrical thyristor designed for a 1300V off-state voltage. The doping concentration $N_{DG}$ of the $n^-$-type layer 2a amounts to $8.10^{13}$ donors/cm$^3$ which corresponds to a resistivity of 60 Ωcm. The thickness $W_{n-}$ of the $n^-$-type layer 2a is 100μ. The doping concentration $N_{DG}$ and the thickness $w_{n-}$ of the $n^-$-type layer 2a are selected to be such that at the highest forward off-state or blocking voltage $v_{Dmax}$, the maximum value $E_2$ for the field intensity at the $pn^-$ junction $J_2$ is about $1.5.10^5$V/cm and the value $E_{hl}$ of the field intensity at the $nn^-$ junction $J_{hl}$ lies at about $E_2/4$. By giving the off-state voltage $v_{Dmax}$ and the field intensity values $E_2$ and $E_{hl}$, the thickness $w_{n-}$ and the doping concentration $N_{DG}$ of $n^-$-type layer 2 are clearly defined if the curves of the two doping profiles, which are generated during the production of the control base zone 3 and n-type layer 2b (stop layer) and which influence the electric field lines at the $pn^-$ junction $J_2$ and at the $nn^-$ junction $J_{hl}$, are known.

Figure 4:
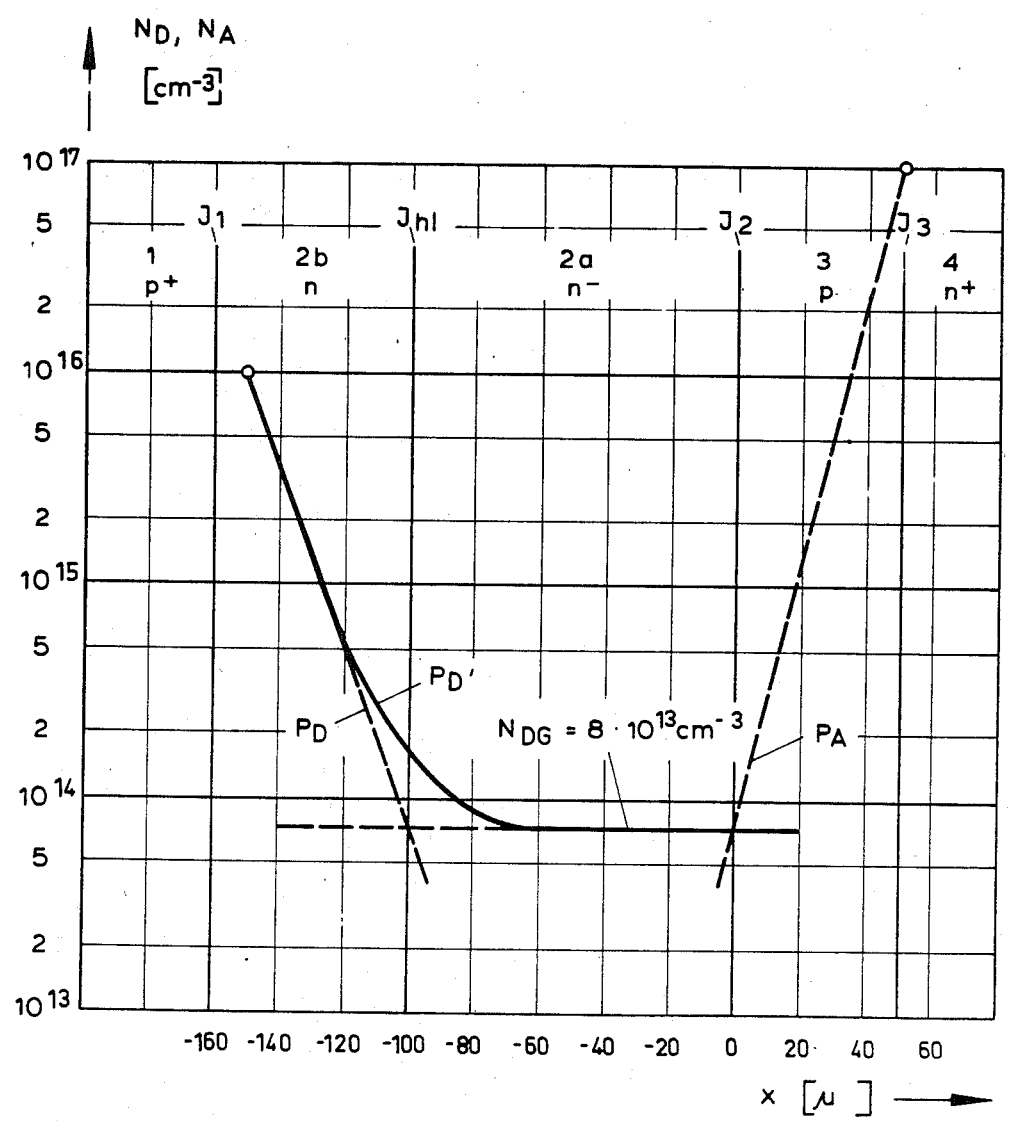
FIG. 4 shows the doping profiles of the n-type layers and of the p-type control base zone in an asymmetrical thyristor according to the invention having the field intensity curve of FIG. 3 at a forward off-state voltage of 1300V.

FIG. 4 shows these doping profiles on which the field intensity curve $E(x)$ of FIG. 3 is based. The donor profile is composed of the basic donor doping $N_{DG}$ in layer 2a and an exponential profile $P_D$ (in layer 2b) superposed thereon which has the same value as the basic donor doping at the $nn^-$ junction $J_{hl}$ and rises to $10^{16}$cm$^{-3}$ in the direction toward pn junction $J_1$ along a path of a length X of 50μ. The resulting donor profile $P_D'$ does not result in a sharp interface between the $n^-$-type layer 2a and the n-type layer 2b, but in view of the fact that the resulting donor concentration must be equal to $2N_{DG}$, the location of junction $J_{hl}$ is clearly defined. The associated exponential acceptor profile $P_A$ increases into the interior of p-type layer 3 from a value of $N_{DG}$ at $pn^-$ junction $J_2$ to a value of $10^{17}$cm$^{-3}$ along a path of 50μ in length x. The flat or gradual donor profile $P_D$, as shown in FIG. 4, and low doping $N_{DG}$, as well as a small thickness $w_{n-}$ of $n^-$-type layer 2a cause the space charge zone to penetrate deeply into the n-type layer 2b if an off-state voltage is applied. This can illustratively be understood as follows. The donors present in the $n^-$-type layer 2a are not sufficient to furnish a positive space charge of an intensity sufficient to build up a field corresponding to the given voltage. The missing positive space charge is obtained in that the space charge zone extends into the n-type layer 2b. Due to the slow increase of the donor concentration in view of the flat doping gradient, a broad area adjacent the $nn^-$ junction $J_{hl}$ is included in the space charge zone.

However, deep penetration of the space charge zone into the n-type layer 2b when a static off-state voltage is present is not desirable because this increases the current gain factor $a_{p+np}$ of the partial transistor composed of $p^+$-type emitter zone 1, layers 2a and 2b of base zone 2, and p-type control base zone 3, and would lead to worsening of the off-state blocking characteristics. However, the above-described determination of the doping $N_{DG}$ and the thickness $w_{n-}$ of the n⁻-type layer 2a by predetermining the maximum static off-state voltage $v_{Dmax}$ as well as field intensity values $E_2$ and $E_{hl}$ assures that the space charge zone penetrates only slightly into the n-type layer 2b in spite of the flat donor profile $P_D$ of FIG. 4. This is evident by the field intensity curve 10' shown in FIG. 3. There the penetration depth of the space charge zone into the n-type layer 2b, identified by the left base point of curve 10', is only about $10\mu$.

The donor and acceptor profiles for $N_{DG}=8.10^{13}$ cm⁻³ shown in FIG. 4 result in a net doping $|N_D-N_A|$ shown in FIG. 5, where $N_D$ is the donor concentration and $N_A$ is the acceptor concentration. In FIG. 5, the extension of the acceptor profile of p⁺-type emitter zone 1 into the n-type layer 2b are also considered. From the approximately exponential donor profile of FIG. 4 ($N_{DG}=8.10^{13}$ cm⁻³) and the compensating extension of the acceptor profile of the p-type emitter zone 1, there results in layer 2b a net doping profile which, for example, reaches its maximum of $7.10^{15}$ cm⁻³ at a distance of $53\mu$ from nn⁻ junction $J_{hl}$ and drops sharply to pn junction $J_1$ at a distance of $60\mu$ from nn⁻ junction $J_{hl}$.

This example of a net doping profile produces the desired flat nn⁻ junction $J_{hl}$ since the net doping concentration in the n-type layer 2b increases essentially exponentially to its maximum value from the interface with n⁻-type layer 2a in the direction toward the pn junction $J_1$ at the anode side, along a path length x of at least $50\mu$. According to a known dimensioning rule, this maximum value for the net doping $|N_D-N_A|$ lies at $2.10^{15}$ to $4.10^{16}$ cm⁻³. Net doping profiles which produce flat nn⁻ junctions $J_{hl}$ can be realized by diffusion processes, possibly also in combination with epitaxy and ion implantation.

It has been found that for practical dimensioning of an asymmetrical thyristor, the stated maximum value $E_2$ of about $1.5.10^5$V/cm for the field intensity cannot be exceeded significantly. At this value, charge carrier multiplication is still so slight that no undesirably high off-state current flows at the maximum junction temperature. Due to the rapidly increasing charge carrier multiplication in conjunction with the current dependency of the current gain factor $a_{p+np}$ of the partial transistor composed of p⁺-type emitter zone 1, layers 2a and 2b of the n-type base zone and p-type control base zone 3, greater values than the maximum value $E_2$ lead to an unduly high off-state current.

The production of an asymmetrical thyristor according to the invention will be described in greater detail below with reference to several examples.

EXAMPLE 1

Production of an asymmetrical thyristor (ASCR) having an n⁺pn⁻np⁺ layer sequence, with the n-conductive layer 2b' being produced by epitaxy (FIGS. 6a–6i).

In this example, float-zone silicon crystals having a diameter of, for example, 60 mm are used as the starting material. The crystals have been made weakly n-conductive by doping with phosphorus, with the phosphorus doping having been effected by neutron irradiation. The magnitude of the phosphorus doping is dimensioned to correspond to the desired blocking capability of the thyristor. In the example given here of an asymmetrical thyristor having a maximum forward off-state voltage $v_{DRM}=2000$V, the resistivity of the starting crystal is selected to be $\rho=110$ $\Omega$cm$\pm20\%$.

Figure 6A:
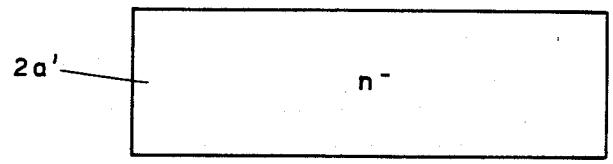
FIGS. 6a–6i illustrate the process steps according to the invention for the production of an asymmetrical thyristor configured according to FIGS. 2 to 5, with the n-conductive layer 2b being produced by means of epitaxy.
Figure 6B:
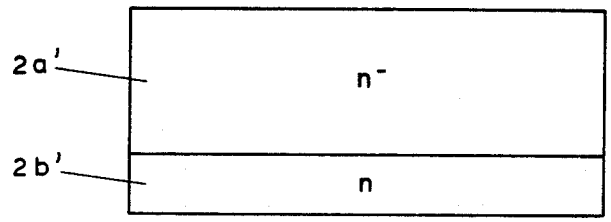

With the known methods of silicon processing, sawing, lapping and unilateral polishing, the starting crystal is processed into substrate wafers 2a' of a thickness of $280\mu.0$ (FIG. 6a). As shown in FIG. 6b, an epitaxial layer 2b', 45 to $55\mu$ thick, then is deposited on the polished side of this weakly n-conductive substrate 2a', with a phosphorus doping of approximately $1.3.10^{17}$ atoms/cm³ being applied to correspond to a resistivity of $\rho=0.075$ $\Omega$cm$\pm10\%$.

Figure 6C:
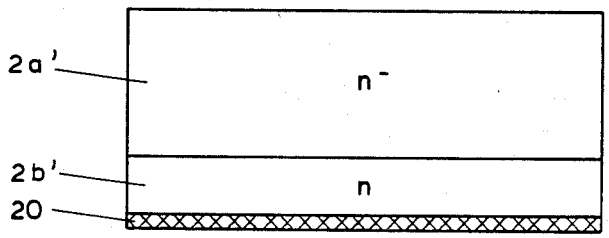

After a first oxidation step, for example, for 7 hours in flowing, moist oxygen, and a subsequent unilateral etching away of the grown oxide layer on the surface of n⁻-type zone 2a', a unilaterally oxidized silicon wafer, i.e., with an oxide layer 20 on only one major surface, is obtained as shown in FIG. 6c. After this process step, the comparatively highly phosphorus doped zone 2b' is secured against losses of phosphorus as a result of the phosphorus diffusing out during further high temperature steps by the oxide layer 20. At the same time, undesirable phosphorus doping is prevented from being deposited on the surface of n⁻-type zone 2a' which is not masked with an oxide layer. The thickness of oxide layer 20 is 1 to $2\mu$ and is not critical for the success of the process.

Figure 6D:
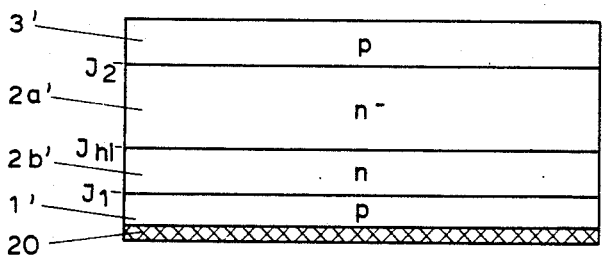

In the next process step, the unilaterally oxidized silicon wafer is provided with a gallium doping by means of ampul diffusion according to a known technique (e.g., stacking silicon wafers in a unilaterally closed quartz tube with quartz spacers, adding gallium sources in the form of silicon cubes into which about 20 mg gallium have been alloyed, and closing the tube after backfilling with argon as a protective gas at a pressure of about 230 mbar). This gallium diffusion is performed for a duration of 35 hours at a temperature of 1255° C. As shown in FIG. 6d, this diffusion produces three changes in the zone sequence of the silicon wafer. On the unmasked side of the silicon wafer, the later cathode side of the thyristor, a p-conductive zone 3' is formed to a penetration depth of $60\mu$, with this zone 3' having a gallium surface concentration of $1.10^{18}$ to $6.10^{18}$ atoms/cm³ and a sheet resistance of about $R_s=20$ $\Omega/\square$, measured at the surface. Since silicon oxide does not have a masking effect for the gallium doping substance, a p-conductive zone 1' is simultaneously formed also on the later anode side of the thyristor in that part of the n-conductive layer 2b' which is redoped and this p-conductive zone 1' produces the pn juction $J_1$ with n-type layer 2b'. After the gallium diffusion process, this pn junction $J_1$ lies at a depth of about 25 to $30\mu$ from the outer surface covered by the oxide layer 20. After this doping process, the sheet resistance of the n-conductive base layer 2b' should lie between 70 and 100 $\Omega/\square$. This parameter can be checked by step-wise removal of silicon from a prepared test wafer and making 4-point sample measurements on the test wafer. Due to diffusion into the weakly doped n⁻-type zone 2a', the n-conductive layer 2b' loses the steep concentration gradient at the nn⁻ junction $J_{hl}$ which it had on the basis of the epitaxial production process. After this process step, the nn⁻ junction $J_{hl}$ lies at a depth of about $80\mu$, measured from the surface of the p-conductive zone 1' on the anode side.

Figure 6E:
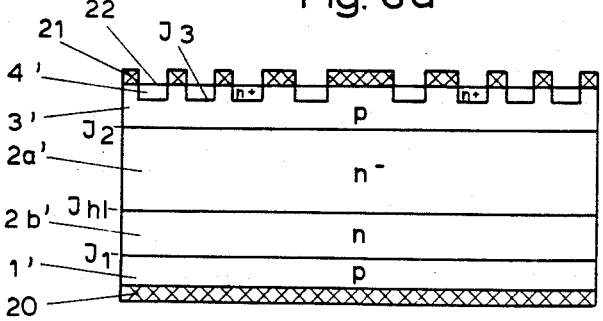

In a subsequent second oxidation step, for example for a duration of 7 hours at 1150° C. in moist, flowing oxygen, the silicon wafer having the zone or layer sequence according to FIG. 6d is provided with an oxide layer 21 also on the outer surface of p-conductive zone 3' as shown in FIG. 6e.

By means of known photolithographic processes, windows 22 are etched into this oxide layer 21 and through these windows 22, the n+-type emitter layer 4' is produced in a further high temperature step, for example, by means of a typical phosphorus diffusion for a duration of 4 to 8 hours at 1,260° C. and with a surface concentration of about $5.10^{21}$ phosphorus atoms/cm$^3$. The resulting zone sequence is shown schematically in FIG. 6e. With respect to the geometric shape and arrangement of windows 22, the dimensioning considerations known in thyristor technology apply; for example, an amplifying gate with a branched primary emitter will be selected to realize low turn-on losses and emitter shorts will be provided to realize high critical rates of rise of off-state voltage dv/dt$_{crit}$.

Figure 6F:
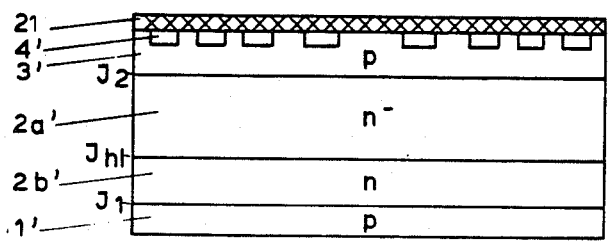
Figure 6G:
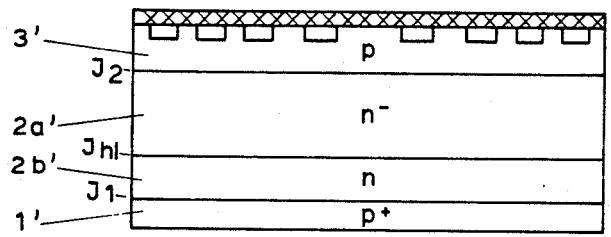

As shown in FIG. 6f, in a third oxidation step, for example for a duration of 2 hours at 1150° C., in flowing, moist oxygen, windows 22 in the oxide layer 21 are closed again with a silicon oxide layer, and then oxide layer 20 on the anode side is removed completely. A diffusion of boron for 1 to 3 hours at 1255° C. is then provided to raise the acceptor concentration in the p+-type emitter layer 1' to $N_s$=approximately $10^{20}$ atoms/cm$^3$. Thus the zone sequence shown in FIG. 6g results.

The stated times and temperatures for the phosphorus diffusion to produce n+-type emitter layer 4' and the boron diffusion to produce p+-type emitter layer 1' are merely exemplary values with which the production process can be implemented successfully. The doping sources for the phosphorus diffusion may be, for example POCl$_3$ or PBr$_3$, and the doping sources for the boron diffusion may be, for example, boronitride wafers or BBr$_3$ as standard methods for doping n+-conductive and p+- conductive zones. In the example described here, the time periods in each individual case are selected in such a manner that the impurity profile shown in FIG. 9 results at the end of the last high temperature step, the boron diffusion.

After the complete removal of oxide layer 21 on the cathode side, the lifetime of the injected charge carriers in layers 2a' and 2b' is reduced in a known manner by the diffusion of, for example, gold atoms which act as recombination centers in a silicon crystal. The application of the gold atoms can be effected by vapor-deposition on the silicon wafers in a high vacuum as well as by chemical deposition from an acid gold salt solution. In the illustrated example, the typical temperature for the gold diffusion lies at about 830° to 840° C. The time duration is 1 hours.

Figure 6H:
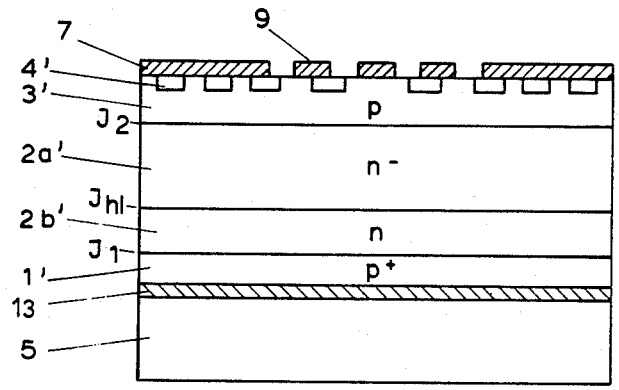

Following this gold diffusion, and as shown in FIG. 6h, the silicon wafer of the thyristor is provided in a known manner with metal contacts 9 and 7 for the respective gate and cathode terminals and is connected with a molybdenum wafer 5 by means of an alloying process using a foil of eutectic Al-Si 13 about 30μ thick.

Figure 6I:
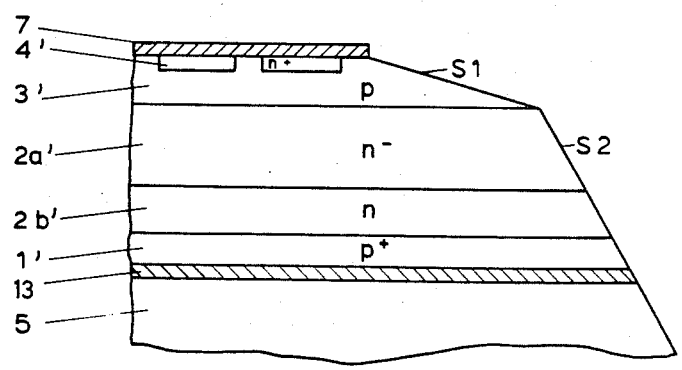

Thereafter, the edge surface of the silicon wafer is worked or processed to remove shorts and damaged crystal regions, for example by sand blasting, grinding with silicon carbide in a semishell or removal by means of a diamond tool, in such a manner that a relatively flat bevel surface S$_1$, and a relatively steep bevel surface S$_2$ result as shown in FIG. 6i. The angle for the steep bevel surface S$_2$ lies typically between 40° and 60°, and the angle for the flat bevel surface S$_1$ lies typically between 3° and 5°. The further required steps, namely etching the edge in a mixture of nitric acid, hydrofluoric acid and acetic acid, covering the edge with silicone rubber, applying pressure contact current leads and encapsulating the wafer in a hermetically sealed housing, do not differ from the methods customary in the thyristor art.

Figure 9:
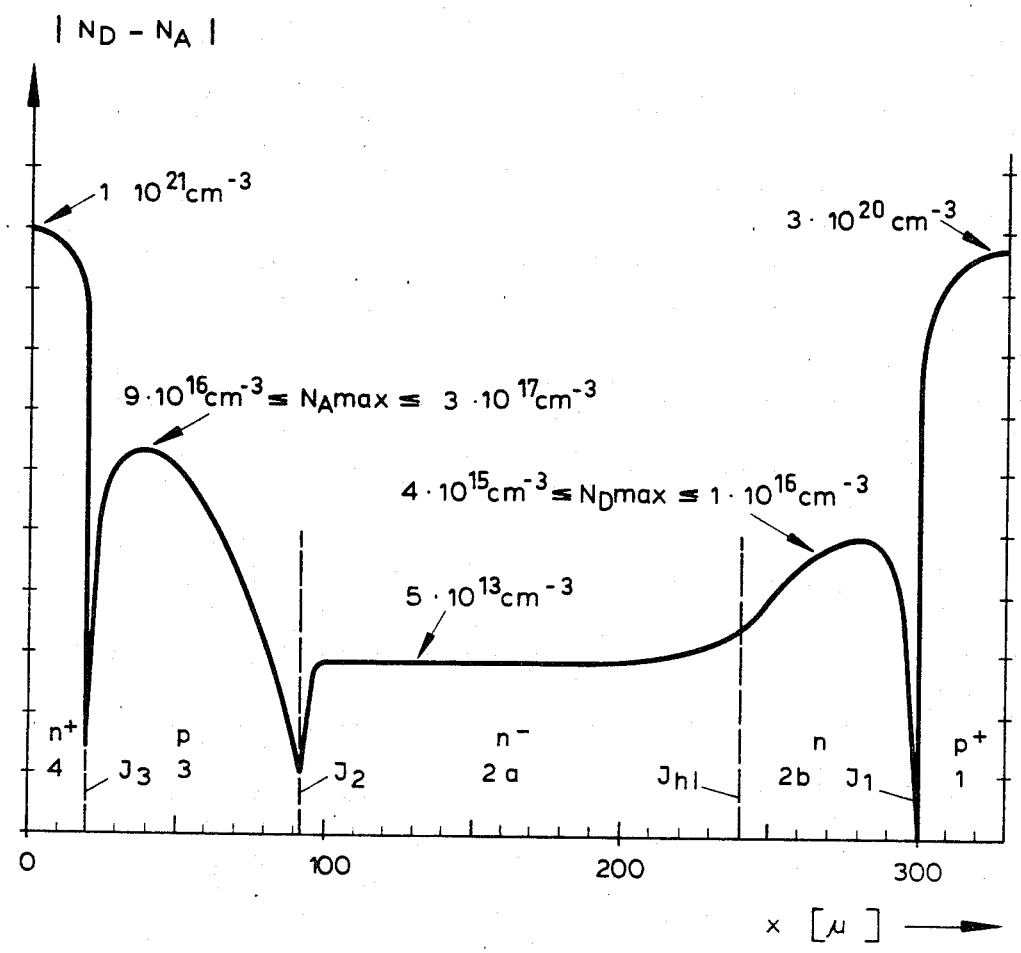
FIG. 9 shows a further doping curve and the thickness dimensions of the zones of an asymmetrical thyristor according to the invention.

In FIG. 9, which shows the concentration profiles in an n+pn−np+ ASCR as produced above, the following parameters apply:

Thickness of the silicon wafer: 330μ.

Thickness of n+-type emitter 4: 15 to 30μ, typically 20μ.

Thickness of control base zone 3: 50 to 70μ, typically 60μ.

Thickness of weakly n-doped region 2a: 140 to 170μ, typically 160μ.

Thickness of n-doped zone 2b: 55 to 75μ, typically 60μ.

Thickness of p+-doped emitter zone 1: 25 to 35μ, typically 30μ.

Maximum net acceptor concentration in the control base zone 3: $N_{Amax}$=$9.10^{16}$ to $3.10^{17}$ atoms/cm$^3$.

Maximum net donor concentration in zone 2b: $N_{Dmax}$=$4.10^{15}$ to $1.10^{16}$ atoms/cm$_3$.

The practical embodiment employing silicon wafers having a diameter of 60 mm for a blocking capability of 2000V and a substrate disk of 56 mm diameter results in a high power thyristor as it is required for drives, for example, in traction devices.

EXAMPLE 2

Production of an asymmetrical thryristor (ASCR) having an n+pn−np+ zone sequence, with n-conductive layer 2b'' being produced by ion implantation from phosphorus atoms.

Float-zone silicon crystals having a diameter of, for example 76.2 mm are used as the starting material. The crystals are weakly n-conductive due to phosphorus doping, with the phosphorus doping being produced by neutron irradiation. In the example described here for an asymmetrical thyristor having a maximum forward off-state voltage V$_{DRM}$=1300 V, the resistivity of the starting crystal is selected to be $\rho$=60 Ωcm±20%.

Figure 7A:
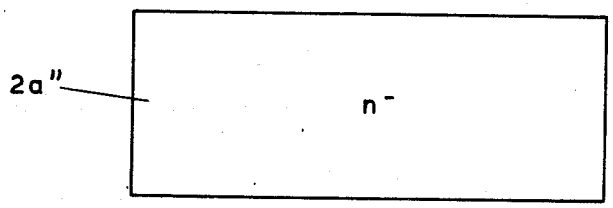
FIGS. 7a–7d illustrate the process steps according to the invention for the production of the n-conductive base zone for an asymmetrical thyristor configured according to FIGS. 2 to 5, with the n-conductive layer 2b being produced by means of ion implantation of phosphorus atoms.
Figure 7B:
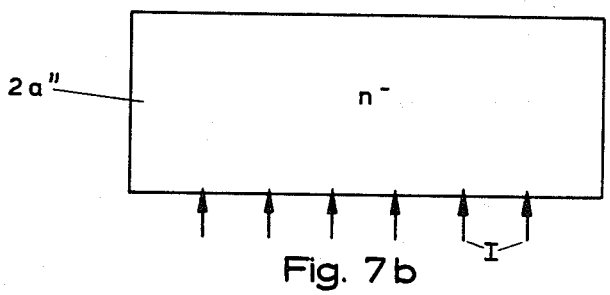

By sawing and lapping, the starting crystal is processed into silicon wafers 2a'' having a thickness of 250±5 μm (see FIG. 7a). One surface of the silicon wafer, the later anode side of the thyristor, is covered according to FIG. 7b by ion implantation at an acceleration voltage of about 150 kV with about $3.10^{15}$ phosphorus atoms/cm$^2$. The ion implantation as a reproducible, homogeneous process is particularly well suited to set the doping concentration of zone 2b''.

Figure 7C:
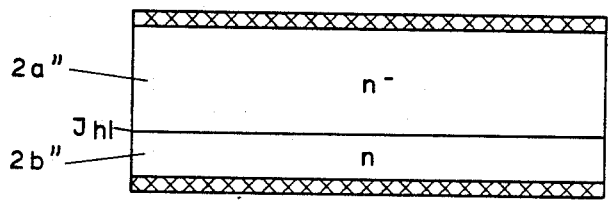

After a first oxidation step, for example for a duration of 7 hours at 1150° C. in flowing, moist oxygen, and a subsequent diffusion for a duration of 80 hours at 1255° C., a silicon wafer is obtained, as shown in FIG. 7c, which is composed of an n−-conductive layer 2a'' and an n-conductive layer 2b''. The nn− junction J$_{h1}$ should lie at a depth of about 60μ, measured from the surface of n-conductive layer 2b''. The sheet resistance of n-conductive layer 2b'', measured at a deoxidized test wafer, should be about R$_s$=8 Ω/□.

Figure 7D:
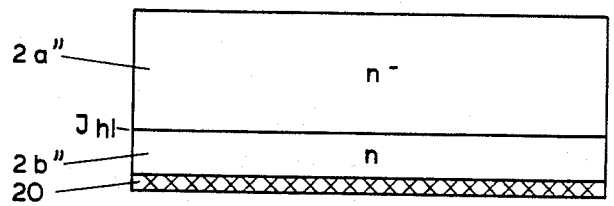

During the next process step, the silicon wafer is deoxidized on the surface of the n−-type layer 2a''. This state of the silicon wafer (see FIG. 7d) substantially corresponds to the state of FIG. 6c, as explained in detail above in connection with Example 1. However, there is the difference that the phosphorus doping of the n-conductive layer 2b' in FIG. 6c has a box profile, while the phosphorus doping of n-type layer 2b'' in FIG. 7d has a diffusion profile, i.e. a Gaussian profile.

The further process steps, gallium diffusion, oxide masking, phosphorus diffusion, renewed oxide masking and boron diffusion, do not differ from those of Example 1 (see FIGS. 6d to 6g). During the process sequence, the impurity profiles of the n+-type emitter zone 4, the control base zone 3, the n-doped layer 2b and the p+-doped emitter zone 1 are likewise set. The thickness of the weakly doped region 2a, corresponding to the low blocking capability, is about 90μ.

In this component, which has a blocking capability of only 1300V, the typical temperature for the gold diffusion lies at approximately 850° to 860° C., corresponding to a desired turn-off time between 8 and 15 μs.

In this smaller thyristor, a suitable dividing process follows: cutting the small round thyristor disks out of the silicon wafer which has a diameter of 76.2 mm by means of laser separating or ultrasound drilling, producing the metal gate and cathode terminals and alloying the disk to a molybdenum substrate. Edge working, passivation and encapsulation are performed as explained in connection with Example 1.

EXAMPLE 3

Production of an asymmetrical thyristor (ASCR) having an n+pn− np+ zone sequence, with n-conductive zone 2b''' being produced by phosphorus deposition from planar solid-state sources.

Float-zone silicon crystals made weakly n-conductive by phosphorus doping and having a diameter of, for example, 60 mm are used as the starting material, with the phosphorus doping being produced by neutron irradiation. In the example of an asymmetrical thyristor described here, which has a maximum forward off-state voltage $v_{DRM}$=1300V, the resistivity of the starting crystal is selected to be $\rho$=60 Ωcm±20%.

Figure 8A:
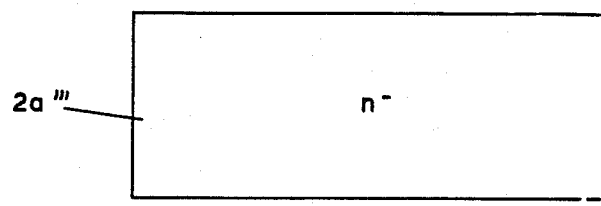
FIGS. 8a–8f illustrate the process steps according to the invention for the production of the n-conductive base zone for an asymmetrical thyristor configured according to FIGS. 2 to 5, with the n-conductive layer 2b being produced by phosphorus deposition from planar solid-state sources.
Figure 8B:
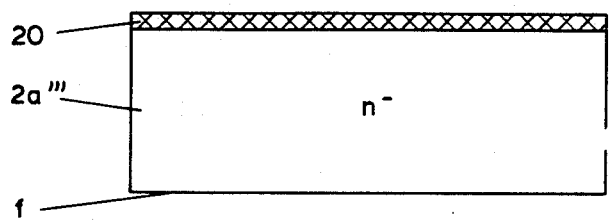
Figure 8C:
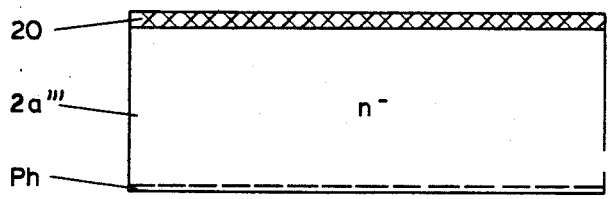

By sawing and lapping, the crystal is processed into silicon wafers 2a''' having a thickness of 250±μm, as shown in FIG. 8a. In a first oxidation step, for example, for a duration of 7 hours at 1150° C. in flowing, moist oxygen, the surfaces of the cleaned silicon wafers are provided with an oxide layer. Thereafter, one side of the silicon wafer is completely deoxidized so that an oxide layer 20 remains on only one surface as shown in FIG. 8b. Thereafter, in a deposition process the exposed side is doped with phosphorus (FIG. 8c). Since the required surface concentration of this phosphorus doping lies below the solubility limit by more than two powers of ten, it is of advantage to employ none of the customary liquid doping substance sources, such as for example POCl₃ or PBr₃. The reproducibility and homogeneity of a deposition from these sources are unsatisfactory for the production of n-conductive layer 2b''' of the thyristor.

The process of phosphorus deposition employed here resides in that the silicon wafers and silicon pyrophosphate containing source disks ($SiP_2O_7$) are alternatingly stacked in quartz trays, with the space between a source disk and a silicon wafer being about 1.5 mm. If this arrangement is introduced into a conventional diffusion furnace equipped with a quartz tube and heated to temperatures between 850° and 1000° C. in a weak stream of nitrogen, $P_2O_5$ evaporates from the source disks onto the silicon wafers and results in a homogeneous phosphorus doping which can be monitored by way of the temperature and the duration of the process. In the present example, the phosphorus is deposited on the silicon wafers for a period of 1 hour at 850° C. (see FIG. 8c).

Figure 8D:
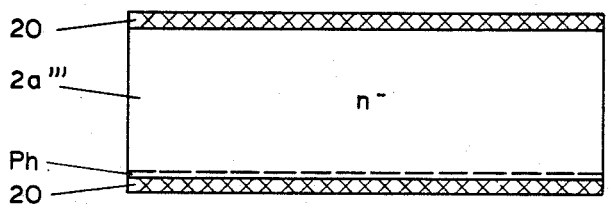
Figure 8E:
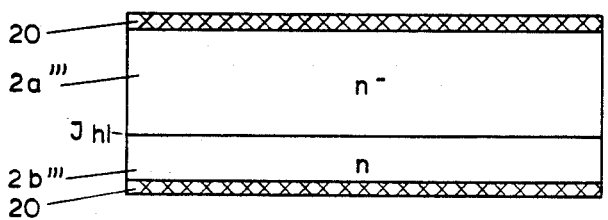

The silicon wafers are then taken from the tray and, in a second oxidation step, are completely oxidized in moist, flowing oxygen for a period of 7 hours at 1150° C. (see FIG. 8d). Thereafter, the phosphorus doping is diffused in at a temperature of 1255° C. for a duration of 60 to 80 hours. After this high temperature step, the state of which is shown in FIG. 8e, the penetration depth of the n-conductive layer 2b''' lies at about 60μ, measured from the surface of the n-conductive layer 2b'''. The sheet resistance of the n-conductive layer 2b''', measured at a deoxidized test wafer, should be about $R_s$=8 Ω/□.

Figure 8F:
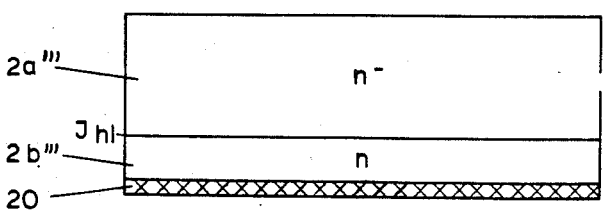

In the next process step, the silicon wafers are deoxidized on one side, i.e. on the surface of the n−-type layer 2a'''. The state of the disk shown in FIG. 8f, now substantially corresponds to the state according to FIGS. 6c and 7d, respectively. Further process steps, such as the gallium diffusion, oxide masking, phosphorus diffusion of the n+-type emitter, further oxide masking and boron diffusion, coincide with the process steps of Example 2.

The present disclosure relates to the subject matter disclosed in Federal Republic of Germany, patent application No. P 35 31 631.4, filed Sept. 5th, 1985, the entire specification of which is incorporated herein by reference.

It will be understood that the above description of the present invention is susceptible to various modifications, changes and adaptations, and the same are intended to be comprehended within the meaning and range of equivalents of the appended claims.

What is claimed is:

1. In an asymmetrical thyristor comprising a wafer-shaped semiconductor body having at least first, second, third and fourth successive zones of alternatingly opposite conductivity types disposed between its major surfaces with said first and fourth zones being highly doped p+ and n+ outer emitter zones, respectively, with said third zone being a p-type control base zone, and with said second zone being an n-conductive base zone composed of a weakly doped n−-type layer adjacent said third zone and a higher doped n-type layer adjacent said first outer p+-type zone, respective main electrodes contacting said first and fourth emitter zones at the respective said major surfaces, and a control electrode contacting said third zone; the improvement wherein: the doping concentration in said n-type layer increases essentially exponentially to its maximum value from the nn− junction between said layers of said second zone in the direction toward the pn junction between said first zone and said n-type layer along a path at least 50μ in length; and the doping concentration and the thickness of said n−-type layer are dimensioned such that the intensity of the electric field E(x) in said n− layer, when a forward blocking voltage is applied to said main electrodes, has an approximately linear curve having a maximum value $E_2$ at the pn− junction formed by said third zone and said n−-type layer and a minimum value $E_{h1}$ at said nn− junction, with said maximum value $E_2$, at the maximum forward blocking voltage for which said thyristor is designed, being approximately $1.5 \times 10^5$ V/cm and said minimum value $E_{h1}$ lying in a range of 0.1 $E_2$ to 0.4 $E_2$.

2. A asymmetrical thyristor as defined in claim 1, wherein said minimum value $E_{h1}$ is in the range of 0.2 $E_2$ to 0.3 $E_2$.

3. An asymmetrical thyristor as defined in claim 1, wherein said pn junction between said first zone and said n-type layer is at least 25$\mu$ from the outer surface of said first zone.

* * * * *